(12) United States Patent
Mizoguchi

(10) Patent No.: US 10,778,015 B2
(45) Date of Patent: Sep. 15, 2020

(54) VOLTAGE DETECTION APPARATUS

(71) Applicant: DENSO CORPORATION, Kariya, Aichi-pref. (JP)

(72) Inventor: Hayato Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 347 days.

(21) Appl. No.: 15/925,046

(22) Filed: Mar. 19, 2018

(65) Prior Publication Data

US 2018/0278067 A1 Sep. 27, 2018

(30) Foreign Application Priority Data

Mar. 21, 2017 (JP) .................................. 2017-55073

(51) Int. Cl.
| | |
|---|---|
| *H01M 10/46* | (2006.01) |
| *H02J 7/00* | (2006.01) |
| *B60L 3/12* | (2006.01) |
| *H01M 10/48* | (2006.01) |
| *G01R 31/396* | (2019.01) |
| *G01R 31/3835* | (2019.01) |
| *B60L 58/10* | (2019.01) |
| *G01R 19/165* | (2006.01) |

(52) U.S. Cl.
CPC .............. *H02J 7/0021* (2013.01); *B60L 3/12* (2013.01); *B60L 58/10* (2019.02); *G01R 19/16542* (2013.01); *G01R 31/3835* (2019.01); *G01R 31/396* (2019.01); *H01M 10/482* (2013.01); *H02J 7/0016* (2013.01); *B60L 2240/547* (2013.01); *H01M 2220/20* (2013.01)

(58) Field of Classification Search
CPC ...... H02J 7/0008; H02J 7/0009; H02J 7/0026; H02J 7/0034; H02J 7/0036
USPC ................. 320/116, 118, 134, 136, 152, 162
See application file for complete search history.

(56) References Cited

U.S. PATENT DOCUMENTS

| | | | |
|---|---|---|---|
| 10,249,914 B2* | 4/2019 | Takahashi | B60L 58/10 |
| 2003/0052688 A1 | 3/2003 | Yudahira et al. | |
| 2012/0249074 A1* | 10/2012 | Tsuchiya | G01R 31/3835 320/116 |
| 2013/0106356 A1* | 5/2013 | Nakao | H01M 10/48 320/118 |
| 2014/0147713 A1 | 5/2014 | Mizobe et al. | |
| 2014/0217982 A1* | 8/2014 | Ohkawa | B60L 58/22 320/118 |
| 2017/0160334 A1 | 6/2017 | Kawanaka et al. | |
| 2018/0003775 A1 | 1/2018 | Hashimoto et al. | |

FOREIGN PATENT DOCUMENTS

| | | |
|---|---|---|
| JP | 2016-061717 A | 4/2016 |
| JP | 2016-163410 A | 9/2016 |

* cited by examiner

*Primary Examiner* — Edward Tso
(74) *Attorney, Agent, or Firm* — Oliff PLC

(57) ABSTRACT

A voltage detection apparatus includes a supervisory unit that detects terminal voltage of battery cells that constitute a battery module, a high potential path, a low potential path, a differential amplifier that detects terminal voltage of the battery module. First and third switches are provided on the high potential path and second and fourth switches are provided on the low potential line. The voltage detection apparatus includes a bypass resistor that electrically connects the high potential path and the low potential path.

9 Claims, 12 Drawing Sheets

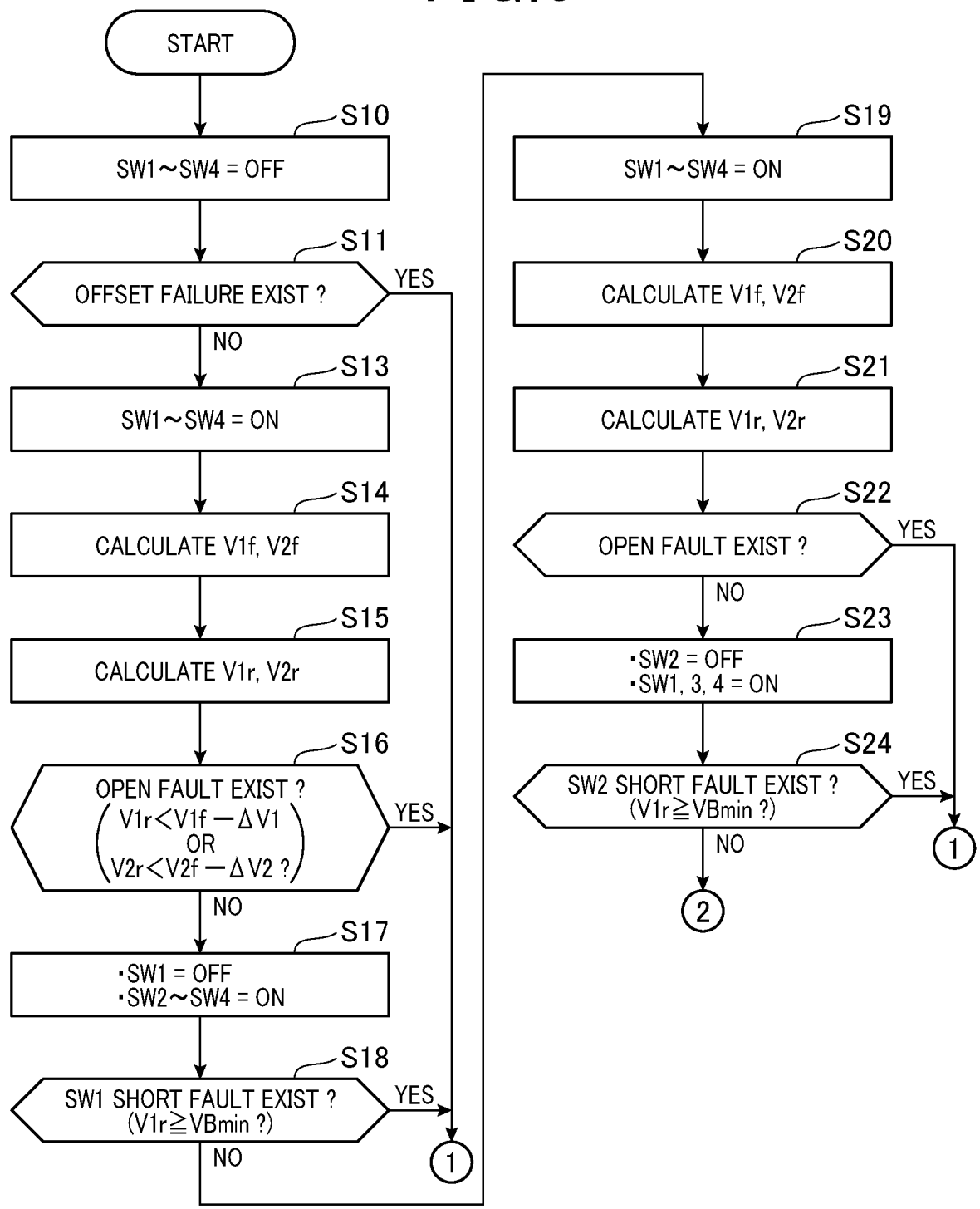

VOLTAGE DETECTION APPARATUS

CROSS-REFERENCE TO RELATED APPLICATION

This application is based on and claims the benefit of priority from earlier Japanese Patent Application No. 2017-55073 filed Mar. 21, 2017, the description of which is incorporated herein by reference.

BACKGROUND

Technical Field

The present disclosure relates to a voltage detection apparatus applied to a system provided with a battery pack.

Conventionally, a voltage detection apparatus is known. For example, JP-A-2014-107979 discloses a voltage detection apparatus that detects terminal voltage of a battery cell that constitutes the battery pack. The battery pack from which the voltage detection apparatus detects the voltage is provided with a detection block configured of a series-connected body in which at least two battery cells are connected in series.

The voltage detection apparatus is provided with a main voltage detection unit and a sub voltage detection unit. The main voltage detection unit detects, for example, a terminal voltage corresponding to each battery cell in the detection block. The sub voltage detection unit detects terminal voltage of the detection block. The sub voltage detection unit is provided as a redundant configuration for voltage detection in view of protecting the function of the voltage detection apparatus.

The above-described detection apparatus includes a high potential path electrically connected to the positive electrode side of the detection block and a low potential line electrically connected to the negative electrode side of the detection block. Each of the high potential line and the low potential line is electrically connected to the sub voltage detection unit. A high potential switch is provided on the high potential line to open or close the high potential line, and a low potential switch is provided on the low potential line to open or close the low potential line. The sub voltage detection unit detects the terminal voltage of the detection block based on a potential difference between the high potential line and the low potential line, under a state where the high potential switch and the low potential switch are closed.

In this regard, abnormalities may occur in a portion necessary for detecting the terminal voltage of the sub voltage detection unit. These abnormalities include a high potential side fault showing an abnormality occurred on a path from the positive electrode side of the detection block to the input side of the sub voltage detection unit via the high potential line, and a low potential side fault showing an abnormality occurred on a path from the negative electrode side of the detection block to the input side of the sub voltage detection unit via the low potential line. For example, the high potential side fault includes an open fault or a short fault of the high potential switch. The voltage detection apparatus may preferably have a configuration capable of accurately detecting a high potential side fault and a low potential side fault.

SUMMARY

The present disclosure has been achieved in light of the above-mentioned circumstances, and provides a voltage detection apparatus capable of accurately detecting faults even when a high potential side fault or a low potential side fault occur.

The present disclosure includes a voltage detection apparatus applied to a system provided with a battery pack including a series-connected body of a plurality of battery cells.

The voltage detection apparatus includes: a detection block configured of the series-connected body including at least two battery cells in the battery cells that constitutes the battery pack; a main voltage detection unit that detects a terminal voltage of an object battery, the object battery being each of the battery cells that constitute the detection block or the series-connected body composed of battery cells of which the number of cells is less than that of the battery cells constituting the detection block; a high potential path electrically connected to a positive electrode side of the detection block at a first end of the high potential path; a low potential path electrically connected to a negative electrode side of the detection block at a first end of the low potential path; a sub voltage detection unit electrically connected to a second end of the high potential path and a second end of the low potential path, detecting a terminal voltage of the detection block based on a potential difference between the high potential path and the low potential path; a high potential switch disposed on the high potential path, opening and closing the high potential path; a low potential switch disposed on the low potential path, opening and closing the low potential path; and a bypass resistor that electrically connects the high potential path and the low potential path, the high potential path and the low potential path being connected between a point closer to the sub voltage detection unit than to the high potential switch on the high potential path, and a point closer to the sub voltage detection unit than to the low potential switch on the low potential path.

A one side cutoff state is defined as a state where either a path between the sub voltage detection unit and the positive electrode side of the detection block or a path between the sub voltage detection unit and the negative electrode side of the detection block is electrically connected, and the other path is cutoff. The one side cutoff state refers to a state where the high potential switch is closed and the low potential switch is opened, for example.

Here, even in the case where high and low potential switches are both closed, if an open fault occurs on the high potential switch, the one side cutoff state may occur. In this case, a difference between an input potential of the sub voltage detection unit through the high potential path and an input potential of the sub voltage detection unit through the low potential path depends on the actual terminal voltage of the detection block. In this respect, depending on the actual terminal voltage value, the terminal voltage detected by the sub voltage detection unit may be within an allowable terminal voltage range of the detection block. As a result, accuracy for detecting the high potential side fault or the low potential side fault may be decreased.

In this regard, according to the present disclosure, a bypass resistor is provided between the sub voltage detection unit side (i.e., closer to the sub voltage detection unit than to the high potential switch) in the high potential path and the voltage detection unit side (i.e., closer to the sub voltage detection unit than to the low potential switch) in the low potential path, to electrically connect therebetween. Hence, for example, in the one side cutoff state due to an open fault on the high potential switch, the input potential of the sub voltage detection unit from the high potential path and the input potential of the sub voltage detection unit from the low potential side can be close with each other. In this case, the terminal voltage detected by the sub voltage detection unit is fixed to a predetermined value which depends on difference between input voltages which are close value. The predetermined value has less dependency on the terminal voltage of the detection block. Accordingly, even when the high potential side fault or the low potential side fault occurs, the fault can accurately be detected by using a state where the terminal voltage detected by the sub voltage detection unit is fixed to the above-described predetermined value, and the fault can be detected. Thus, according to the present disclosure, even when the high potential side fault or the low potential side fault occurs, the fault can be detected accurately.

BRIEF DESCRIPTION OF THE DRAWINGS

In the accompanying drawings:

FIG. 6 is a flowchart showing a procedure of fault determination process;

DETAILED DESCRIPTION OF PREFERRED EMBODIMENTS

First Embodiment

Hereinafter, with reference to the drawings, a first embodiment of a voltage detection apparatus of the present disclosure will be described. The voltage detection apparatus of the present disclosure is applied to a power system installed on a hybrid vehicle or an electric vehicle.

Figure 1:
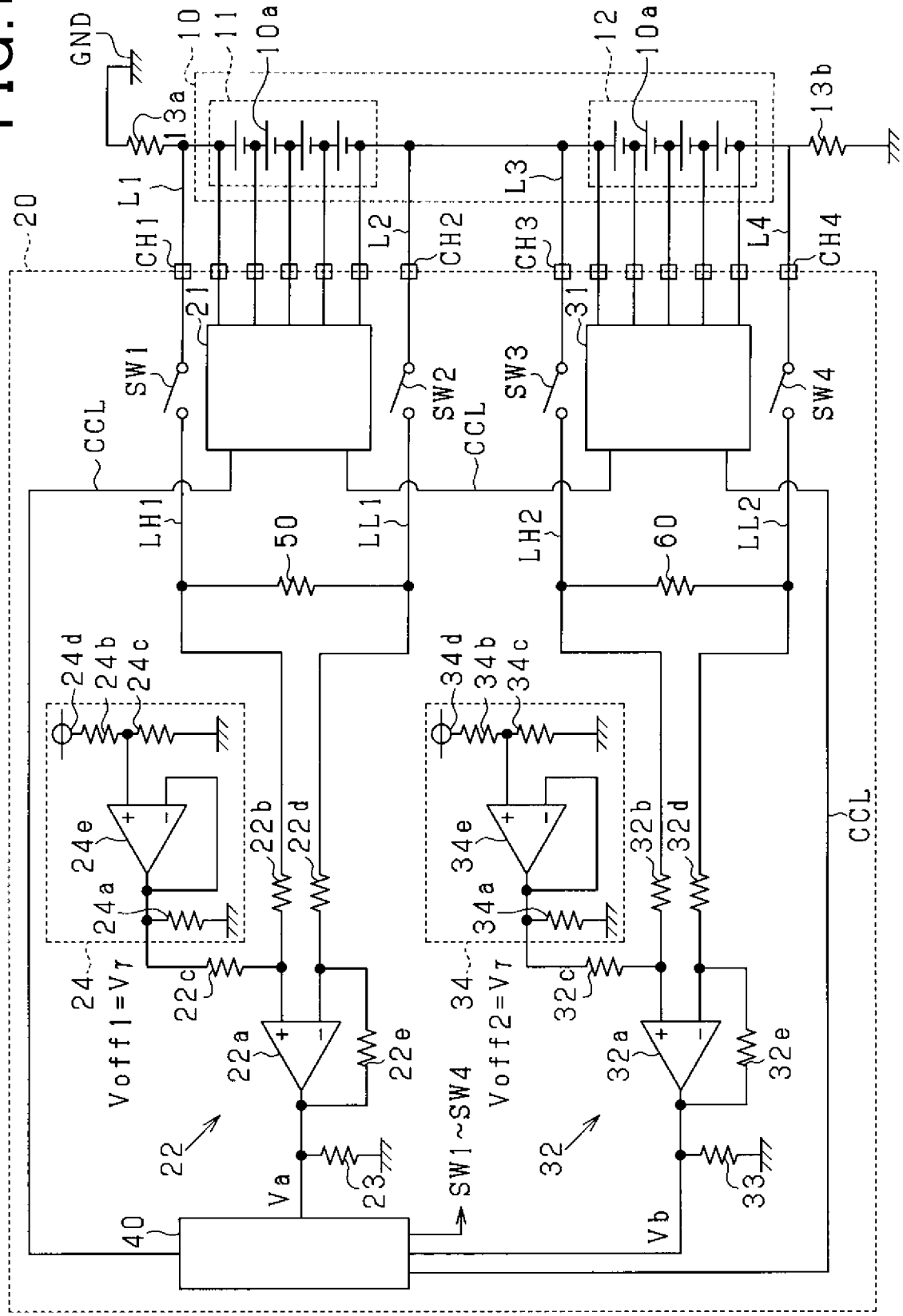
FIG. 1 is a block diagram showing an overall configuration of a power system and a voltage detection apparatus according to the first embodiment of the present disclosure.

As shown in FIG. 1, the power system is provided with a battery pack 10. The battery pack 10 serves as a power source of an on-vehicle electrical load including a traction motor (not shown) of a vehicle. The battery pack 10 is provided with a series connected body including battery cells as a single battery, and the terminal voltage of the battery pack reaches several hundred of volts, for example.

As the battery cell, a lithium ion battery or nickel hydrogen battery or the like can be used. According to the present embodiment, at least two battery cells connected in series (i.e., serial connected body) are integrated to constitute a battery module as a detection block. According to the present embodiment, four battery cells 10a is defined as a battery module. The battery pack 10 is configured of a plurality of the battery modules which are serially connected with each other. According to the present embodiment, for convenience of explanation, the battery pack 10 is defined as a configuration of the first battery module 11 and a second battery module 12.

In the first and second battery modules 11 and 12 which constitute the battery pack 10, the first end of a first insulation resistor 13a is connected to the positive terminal of the first battery module 11 which is a battery module located in the highest potential side. The ground GND as a grounding portion is connected to the second end of the first insulation resistor 13a. The ground GND is a body-earth of a vehicle, for example. In the first and second battery modules 11 and 12 which constitute the battery pack 10, the first end of the second insulation resistor 13b is connected to the negative terminal of the second battery module 12 which is a battery module located in the lowest potential side. The ground GND is connected to the second end of the second insulation resistor 13b.

The voltage detection apparatus 20 includes first and second supervisory units 21 and 31 corresponding to the first and second battery modules respectively, and a control unit 40

The first and second supervisory units 21 and 31 are configured of an integrated circuit. The first supervisory unit 21 has a function of detecting each terminal voltage of the battery cells 10a which constitutes the first battery module 11. That is, according to the present embodiment, respective battery cells 10a are determined as object batteries to be detected. The second supervisory unit 31 has a function of detecting each terminal voltage of the battery cells 10a which constitutes the second battery module 12. The first and second supervisory units 21 and 31 is provided with an analog to digital (AD) conversion unit which converts the detected terminal voltage as analog data to digital data. According to the present embodiment, the supervisory units correspond to main voltage detection unit.

The voltage detection apparatus 20 is provided with a first high potential path LH1, a first low potential path LL1, a first differential amplifier 22, a second high potential path LH2, a second low potential path LL2 and a second differential amplifier 32. A first connecting portion CH1 of the voltage detection apparatus 20 is connected to the first end of the first high potential path LH1, a positive terminal of the first battery module 11 is connected to the first connecting portion CH1 via a first connection path L1. A non-inverting input terminal of a first operational amplifier (op-amp) 22a that constitutes the first differential amplifier 22 is connected to a second end of the first high potential path LH1. A second connecting portion CH2 of the voltage detection apparatus 20 is connected to the first end of the first low potential path LL1, a negative terminal of the first battery module 11 is connected to the second connecting portion CH2 via a second connection path L2. An inverting input terminal of the first op-amp 22a is connected to a second end of the first low potential path LL1.

A third connecting portion CH3 of the voltage detection apparatus 20 is connected to the first end of the second high potential path LH2, a positive terminal of the second battery module 12 is connected to the third connecting portion CH3 via a third connection path L3. A non-inverting input terminal of a second op-amp 32*a* that constitutes the second differential amplifier 32 is connected to a second end of the second high potential path LH2. A fourth connecting portion CH4 of the voltage detection apparatus 20 is connected to the first end of the second low potential path LL2, a negative terminal of the second battery module 12 is connected to the fourth connecting portion CH4 via a fourth connection path L4. An inverting input terminal of the second op-amp 32*a* is connected to a second end of the second low potential path LL2. Each of the connecting portions CH1 to CH4 is configured as a terminal. According to the present embodiment, differential amplifiers 22 and 32 correspond to the sub voltage detection unit.

A first switch SW1 as a high potential switch is provided in the first high potential path LH1, and a second switch SW2 as a low potential switch is provided in the first low potential path LL1. According to the present embodiment, the switches SW1 and SW2 are normally-open type switches and controlled to be ON and OFF by the control unit 40. Note that each switch SW1 and SW2 may be configured of an N-channel MOSFET (metal oxide semiconductor field effect transistor) which constitutes a photo relay. In a pair of N-channel MOSFETs, source terminals are connected with each other.

In the second high potential line LH2, a third switch SW3 as a high potential switch is provided in the second high potential path LH2, and a fourth switch SW4 as a low potential switch is provided in the second low potential path LL2. According to the present embodiment, the switches SW3 and SW4 are normally-open type switches and controlled to be ON and OFF by the control unit 40. Note that each switch SW3 and SW4 may be configured of an N-channel MOSFET which constitutes a photo relay.

The first differential amplifier 22 is provided with first to fourth resistors 22*b* to 22*e*. The first to fourth resistors 22*b* to 22*e* serve as gain resistors of the first differential amplifier. The first resistor 22*b* is disposed in the first high potential path LH1 closer to the first op-amp 22*a* than the first switch SW1 is. The first end of the second resistor 22*c* is disposed in the first high potential path LH1 closer to the first op-amp 22*a* than the first resistor 22*b* is. The third resistor 22*d* is disposed in the first low potential path LL1 closer to the first op-amp 22*a* than the second switch SW2 is. The fourth resistor 22*e* is disposed, in the first low potential path LL1, to connect between a point closer to the first op-amp 22*a* side than the third resistor 22*d* is and the output terminal of the first op-amp 22*a*. The output voltage of the first op-amp 22*a* is outputted to the control unit 40 as a first output voltage Va. According to the present embodiment, the first op-amp 22*a* operates with reference to the potential of the ground GND.

The voltage detection apparatus 20 is provided with a fifth resistor 23 and a first power unit 24. The second end of the fourth resistor 22*e* is connected to the first end of the fifth resistor 23, and the ground GND is connected to the second end of the fifth resistor 23.

The first power unit 24 is provided with first to third power resistors 24*a* to 24*c*, a first constant voltage power source 24*d* and a first power op-amp 24*e*. The second end of the second resistor 22*c* is connected to the first end of the first power resistor 24*a*, and the ground GND is connected to the second end of the first power resistor 24*a*. According to the present embodiment, the output voltage of the first power unit 24 is referred to as a first reference voltage Voff1. The first reference voltage Voff1 is set to be a regulated voltage Vγ. According to the present embodiment, the regulated voltage Vγ is set to be smaller than the terminal voltages of the battery modules 11 and 12. Specifically, the regulated voltage Vγ may be set to be smaller than a minimum value of the terminal voltage range of the battery modules 11 and 12. Note that the regulated voltage Vγ may be set within an allowable input voltage range of the control unit 40 (e.g., 0 to 5 volts).

The second differential amplifier 32 is provided with sixth to ninth resistors 32*b* to 32*e*. The sixth to ninth resistors 32*b* to 32*e* serve as gain resistors of the second differential amplifier 32. The sixth resistor 32*b* is disposed in the second high potential path LH2 closer to the second op-amp 32*a* than the third switch SW3 is. The first end of the seventh resistor 32*c* is disposed in the second high potential path LH2 closer to the second op-amp 32*a* than the sixth resistor 32*b* is. The eighth resistor 32*d* is disposed in the second low potential path LL2 closer to the second op-amp 32*a* than the fourth switch SW4 is. The ninth resistor 32*e* is disposed, in the second low potential path LL2, to connect between a point closer to the second op-amp 32*a* side than the eighth resistor 32*d* is and the output terminal of the second op-amp 32*a*. The output voltage of the second op-amp 32*a* is outputted to the control unit 40 as a second output voltage Vb. According to the present embodiment, the second op-amp 32*a* operates with reference to the potential of the ground GND.

The voltage detection apparatus 20 is provided with a tenth resistor 33 and a second power unit 34. The second end of the ninth resistor 32*e* is connected to the first end of the tenth resistor 33, and the ground GND is connected to the second end of the tenth resistor 33.

The second power unit 34 is provided with fourth to sixth power resistors 34*a* to 34*c*, a second constant voltage power source 34*d* and a second power op-amp 34*e*. The second end of the seventh resistor 32*c* is connected to the first end of the fourth power resistor 34*a*, and the ground GND is connected to the second end of the fourth power resistor 34*a*. According to the present embodiment, the output voltage of the second power unit 34 is referred to as a second reference voltage Voff2. The second reference voltage Voff2 is set to be a regulated voltage Vγ similar to the first reference voltage Voff1.

Each of the control unit 40, and the first and second supervisory units 21 and 31 has a communication function. A communication line CCL connects between the control unit 40 and the first supervisory unit 21, between the first supervisory unit 21 and the second supervisory unit 31, and between the second supervisory unit 31 and the control unit 40. In other words, according to the present embodiment, the control unit 40 and the first and second supervisory units 21 and 31 are connected with a daisy chain method. The terminal voltages corresponding to respective battery cells 10*a*, as digital data detected by the first and second supervisory units 21 and 31, are transmitted to the control unit 40 via the communication line CCL.

The control unit 40 outputs a close switch command for the first and second switches SW1 and SW2 when detecting the terminal voltage of the first battery module 11. Thus, the first and second switches SW1 and SW2 become closed state so that the first output voltage Va of the first op-amp 22*a* becomes voltage depending on the terminal voltage of the first battery module 11. The control unit 40 calculates the terminal voltage of the first battery module 11 based on the first output voltage Va. Thereafter, the first and second switches SW1 and SW2 become the opened state.

The control unit 40 outputs a close switch command for the third and fourth switches SW3 and SW4 when detecting the terminal voltage of the second battery module 12. Thus, the third and fourth switches SW3 and SW4 become closed state so that the second output voltage Vb of the second op-amp 32a becomes voltage depending on the terminal voltage of the second battery module 12. The control unit 40 calculates the terminal voltage of the second battery module 12 based on the second output voltage Vb. Thereafter, the third and fourth switches SW3 and SW4 become the opened state.

In the present embodiment, the first supervisory unit 21, the second supervisory unit 31 and the control unit 40 are not limited to an integrated configuration. For example, each of the first supervisory unit 21, the second supervisory unit 31 and the control unit 40 may be disposed apart from each other in different spaces in the vehicle. In this case, the different spaces include, for example, space under a seat and space under a trunk located in the rear side of the vehicle.

The voltage detection apparatus 20 is provided with a first bypass resistor 50 and a second bypass resistor 60. The first end of the first bypass resistor 50 is connected between the first switch SW1 and the first resistor 22b in the first high potential path LH1. The second end of the first bypass resistor 50 is connected between the second switch SW2 and the third resistor 22d in the first low potential path LL1.

The first end of the second bypass resistor 60 is connected between the third switch SW3 and the sixth resistor 32b in the second high potential path LH2. The second end of the second bypass resistor 60 is connected between the fourth switch SW4 and the eighth resistor 32d in the second low potential path LL2. According to the present embodiment, resistance of the first bypass resistor 50 is set to be the same as resistance of the second bypass resistor 60.

The first bypass resistor 50 is provided to improve accuracy for determining occurrence of a first high potential side fault or a first low potential side fault. The first high potential side fault is defined as when a fault occurs in a path from the positive terminal of the first battery module 11 to the non-inverting input terminal of the first op-amp 22a via a first connection path L1, a first connecting portion CH1 and the first high potential path LH1. The first low potential side fault is defined as a fault occurs in a path from the negative terminal of the first battery module 11 to the inverting input terminal of the first op-amp 22a via a second connection path L2, a second connecting portion CH2 and the first low potential path LL1.

The first high potential side fault includes a short fault in which the first switch SW1 is fixed at a closed state and a first high potential open fault. The first high potential open fault includes an open fault in which the first switch SW1 is fixed at a closed state, a disconnection fault in which the first high potential path LH1 is disconnected between the connection point with the first bypass resistor 50 and the first connecting portion CH1, a disconnection fault in which the first connecting path L1 is disconnected, and a fault in which the first connection path L1 is removed from the first connection portion CH1 or the positive terminal of the first battery module 11.

The first low potential side fault includes a short fault of the second switch SW2, and a first low potential open fault. The first low potential open fault includes an open fault of the second switch SW2, a disconnection fault in which the first low potential path LL1 is disconnected between the connection point with the first bypass resistor 50 and the second connecting portion CH2, a disconnection fault in which the second connecting path L2 is disconnected, and a fault in which the second connection path L2 is removed from the second connection portion CH2 or the negative terminal of the first battery module 11.

The second bypass resistor 60 is provided to improve accuracy for determining occurrence of a second high potential side fault or a second low potential side fault. The second high potential side fault is defined as a fault occurs in a path from the positive terminal of the second battery module 12 to the non-inverting input terminal of the second op-amp 32a via a third connection path L3, a third connecting portion CH3 and the second high potential path LH2. The second low potential side fault is defined as a fault occurs in a path from the negative terminal of the second battery module 12 to the inverting input terminal of the second op-amp 32a via a fourth connection path L4, a fourth connecting portion CH4 and the second low potential path LL2.

The second high potential side fault includes a short fault of the third switch SW3 and a second high potential open fault. The second high potential open fault includes an open fault of the third switch SW3, a disconnection fault in which the second high potential path LH2 is disconnected between the connection point with the second bypass resistor 60 and the third connecting portion CH3, a disconnection fault in which the third connecting path L3 is disconnected, and a fault in which the third connection path L3 is removed from the third connection portion CH3 or the positive terminal of the second battery module 12.

The second low potential side fault includes a short fault of the fourth switch SW4 and a second low potential open fault. The second low potential open fault includes an open fault of the fourth switch SW4, a disconnection fault in which the second low potential path LL2 is disconnected between the connection point with the second bypass resistor 60 and the fourth connecting portion CH4, a disconnection fault in which the fourth connecting path L4 is disconnected, and a fault in which the fourth connection path L4 is removed from the fourth connection portion CH4 or the negative terminal of the second battery module 12.

Next, the reason why the accuracy for determining occurrence of fault can be improved by each of the bypass resistors 50 and 60 will be described with a comparison with a configuration without using the bypass resistors 50 and 60.

First, determination of the first and second high potential open faults and the first and second low potential open faults will be described.

Figure 2A:
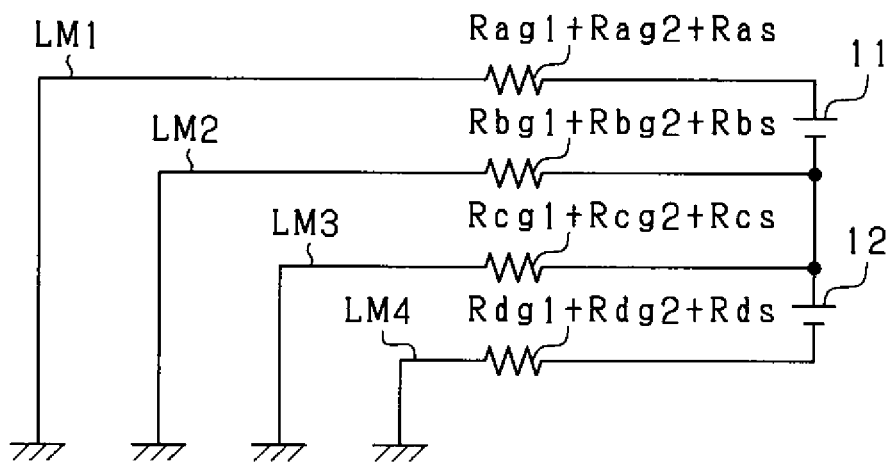
FIGS. 2A and 2B are diagrams each showing an equivalent circuit in the voltage detection apparatus in normal operation.
Figure 2B:
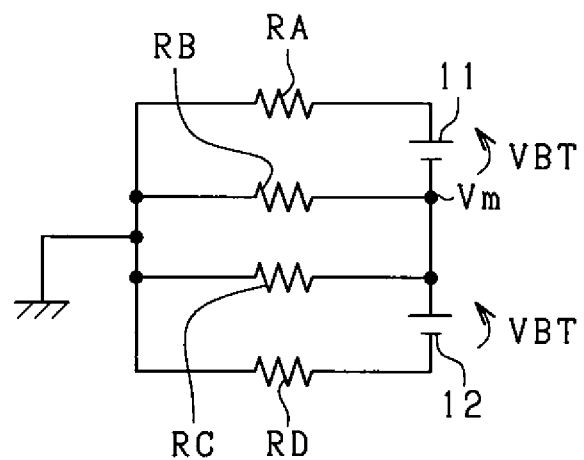

FIGS. 2A and 2B show equivalent circuit in the voltage detection apparatus 20 when the first to fourth switches SW1 to SW4 are all closed under a condition where the first and second bypass resistors 50 and 60 are not provided. In FIG. 2A, a first path LM1 is defined as an electrical path from the positive terminal of the first battery module 11 to the ground GND via the first connection path L1, the first high potential path LH1, the second resistor 22c and the first power resistor 24a. A second path LM2 is defined as an electrical path from the negative terminal of the first battery module 11 to the ground GND via the second connection path L2, the first low potential path LL1, the fourth resistor 22e and the fifth resistor 23. A third path LM3 is defined as an electrical path from the positive terminal of the second battery module 12 to the ground GND via the third connection path L3, the second high potential path LH2, the seventh resistor 32c and the fourth power resistor 34a. A fourth path LM4 is defined as an electrical path from the negative terminal of the second battery module 12 to the ground GND via the fourth connection path L4, the second low potential path LL2, the ninth resistor 32e and the tenth resistor 33.

In FIG. 2A, Rag1 represents resistance of the first resistor 22b, Rag2 represents resistance of the second resistor 22c, Ras represents resistance of the first power resistor 24a. Also, Rbg1 represents resistance of the third resistor 22d, Rbg2 represents resistance of the fourth resistor 22e, and Rbs represents resistance of the fifth resistor 23. Rcg1 represents resistance of the sixth resistor 32b, Rcg2 represents resistance of seventh resistor 32c, Rcs represents resistance of the fourth power resistor 34a. Rdg1 represents resistance of the eighth resistor 32d, Rdg2 represents resistance of the ninth resistor 32e, and Rds represents resistance of the tenth resistor 33. According to the present embodiment, a relationship of Rag1=Rbg1=Rcg1=Rdg1 and a relationship of Rag2=Rbg2=Rcg2=Rdg2 are satisfied.

Further, the equivalent circuit of FIG. 2A can be modified to an equivalent circuit shown in FIG. 2B. In FIG. 2B, RA (=Rag1+Rag2+Ras) represents a first combined resistance, and RB (=Rbg1+Rbg2+Rbs) represents a second combined resistance. RC (=Rcg1+Rcg2+Rcs) represents a third combined resistance, and RD (Rdg1+Rdg2+Rds) represents fourth combined resistance. Each of terminal voltage of the first battery module 11 and the second battery module 12 is referred to as VBT.

In the case where the first to fourth switches SW1 to SW4 are closed state, the intermediate potential Vm, which is potential of an electrical path connecting the negative terminal of the first battery module 11 and the positive terminal of the second battery module 12, corresponds to the ground potential of GND. In other words, the intermediate potential Vm is determined without being influenced by the terminal voltage VBT of the battery module.

Figure 3A:
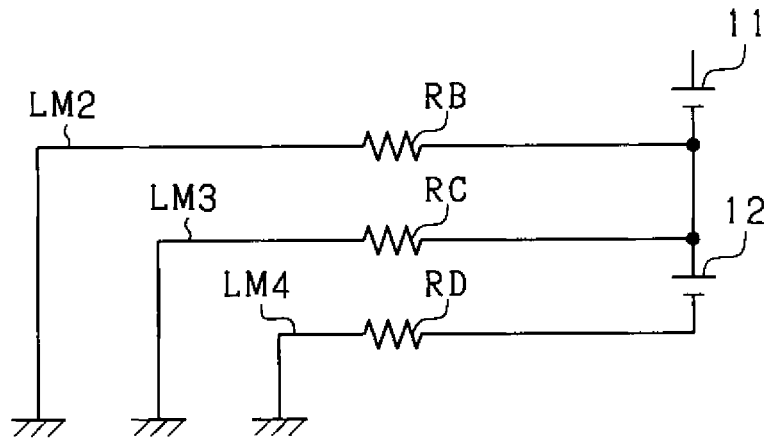
FIGS. 3A, 3B and 3C are diagrams each showing an equivalent circuit in the voltage detection apparatus when an open fault has occurred on a first switch.
Figure 3B:
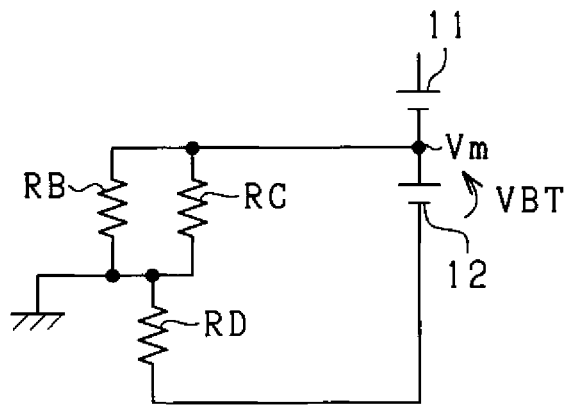
Figure 3C:
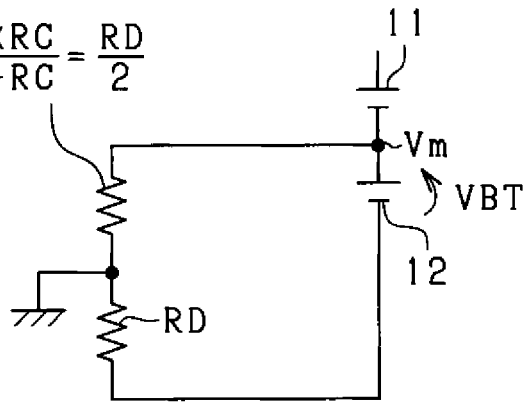

Subsequently, in the case where the first and second bypass resistor 50 and 60 are not provided, an equivalent circuit is shown in FIGS. 3A to 3C, where an open fault has occurred in the first switch SW1 and the second to fourth switches SW2 to SW4 are closed. Note that the equivalent circuit shown in FIG. 3A is modified to obtain an equivalent circuit shown in FIG. 3B, and the equivalent circuit shown in FIG. 3B is modified to obtain an equivalent circuit shown in FIG. 3C. The intermediate potential Vm shown in FIG. 3C is expressed by the following equation (eq1).

$$V_m = \frac{\frac{RB \times RC}{RB + RC}}{RD + \frac{RB \times RC}{RB + RC}} \times VBT \quad (eq\ 1)$$

Assuming a condition RA=RB=RC=RD is satisfied, the above-described equation eq1 can be modified to the following equation eq2.

$$V_m = \frac{\frac{RD}{2}}{RD + \frac{RD}{2}} \times VBT = \frac{VBT}{3} \quad (eq\ 2)$$

The above-equation eq2 shows that the intermediate potential Vm depends on the terminal voltage VBT of the battery module. In the case where an open fault occurs on the first switch SW1 and the second switch SW2 is controlled to be closed, current flows to the first low potential path LL1 from the negative terminal side of the first battery module 11. The first op-amp 22a operates to cancel the current flow. On the other hand, since an open fault has occurred on the first switch SW1, the first reference voltage Voff1 of the first power unit 24 is applied to the non-inverting input terminal of the first op-amp 22a. The first op-amp 22a operates such that the voltage difference of the non-inverting input with respect to the ground GND becomes the first reference voltage Voff1. In this case, the first output voltage Va of the first op-amp 22a is expressed by the following equation (eq3).

$$V_a = \frac{R_{bg}}{R_{bg1}} \times (V_{off1} - V_m) \quad (eq\ 3)$$

In the right side of the equation 3, the intermediate potential Vm which depends on the terminal voltage of the battery module is included. Hence, the first output voltage Va may become a value within the allowable terminal voltage range of the battery module, depending on the terminal voltage VBT of the battery module. Hence, even if an open fault has occurred on the first switch SW1, the terminal voltage of the first battery module 11 which is calculated based on the first output voltage Va may be within the terminal voltage range of the first battery module 11. In this case, occurrence of an open fault of the first switch SW1 cannot be determined.

In contrast, even if an open fault has occurred on the first switch SW1 when the first bypass resistor 50 is provided, input voltage of the non-inverting input terminal and the inverting input terminal of the first op-amp 22a are approximately the same. In this case, the first output voltage Va is almost the same as the first reference voltage Voff1 and does not depend on the terminal voltage VBT. Therefore, in the case where the first bypass resistor 50 is provided, even if an open fault has occurred on the first switch SW1, the first output voltage Va can be fixed to the first reference voltage Voff1. Note that in the case where the fourth switch SW4 is closed and an open fault has occurred on the third switch SW3, since the second bypass resistor 60 is provided, the second output voltage Vb can be fixed to the second reference voltage Voff2. According to the present embodiment, resistance Rbp1 and Rbp2 of the first and second bypass resistors 50 and 60 are set to be extremely smaller than the resistance Rag1 of the first resistor 22b (Rbp1, Rbp2<<Rag1). The resistance Rbp1, Rbp2 of the first and second bypass resistors 50 and 60 may be set to be one tenth or less of the resistance Rag1 of the first resistor 22b, for example.

Figure 4A:
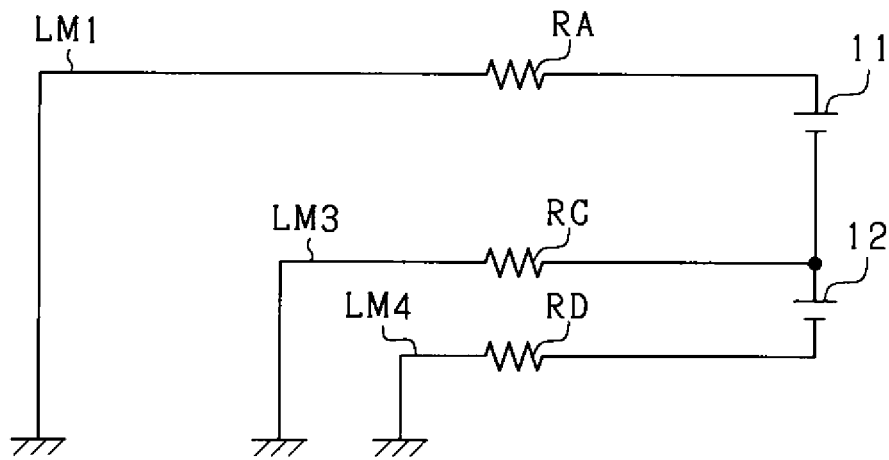
FIGS. 4A, 4B and 4C are diagrams each showing an equivalent circuit in the voltage detection apparatus when an open fault has occurred on a second switch.
Figure 4B:
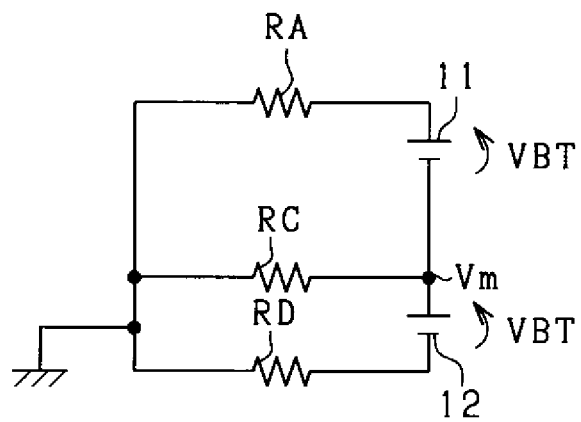
Figure 4C:
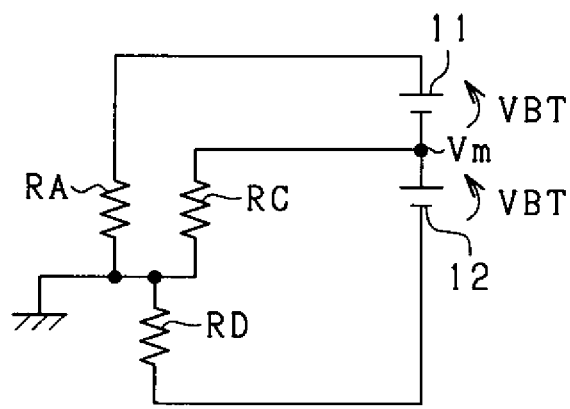

Next, FIGS. 4A to 4C illustrate equivalent circuits when an open fault has occurred on the second switch SW2 and the first, third and fourth switches SW1, SW3 and SW4 are closed in the case where the first and second bypass resistors 50 and 60 are not provided. The equivalent circuit shown in FIG. 4A is modified to an equivalent circuit shown in FIG. 4B, and the equivalent circuit shown in FIG. 4B is modified to an equivalent circuit shown in FIG. 4C.

The intermediate potential Vm shown in FIG. 4C is determined as VBT which is the median value of the difference between the positive electrode potential of the first battery module 11 and the negative electrode potential of the second battery module 12. That is, the intermediate potential Vm varies depending on each terminal voltage VBT of the battery module. Also, the first output voltage Va of the first op-amp 22a shown in FIG. 4 is expressed by the following equation.

$$V_a = \frac{R_{ag2}}{R_{ag1}} \times (V_{off1} - V_m) + V_{off1} \qquad \text{(eq 4)}$$

The right side of the above-equation (eq4) includes the intermediate potential Vm which depends on the terminal voltage VBT of the battery modules. Hence, the first output voltage Va may become a value within the allowable terminal voltage range of the battery module, depending on the terminal voltage VBT of the battery module.

However, when the first bypass resistor 50 is provided, even if an open fault has occurred on the second switch SW2, the input voltage of the non-inverting input terminal and the inverting input terminal of the first op-amp 22*a* become approximately the same. In this case, the first output voltage Va becomes the approximately the same as the first reference voltage Voff1, which does not depend on the terminal voltage VBT. Hence, when the first bypass resistor 50 is provided, even if an open fault has occurred on the second switch SW2, the first output voltage Va can be fixed to the first reference voltage Voff1. Note that even in the case where the third switch SW3 is closed and an open fault has occurred on the fourth switch SW4, since the second bypass resistor 60 is provided, the second output voltage Vb can be fixed to the second reference voltage Voff2.

Accordingly, even in the case where the first and second switches SW1 and SW2 are controlled to be closed, and the first output voltage Va becomes the first reference voltage Voff1 or close voltage, the voltage detection apparatus can determine whether or not a first high potential open fault including an open fault of the first switch SW1, or a first low potential open fault including an open fault of the second switch SW2 has occurred. Also, when the third and fourth switches SW3 and SW4 are controlled to be closed, and the second output voltage Vb becomes the second reference voltage Voff2 or close voltage, the voltage detection apparatus can determine whether or not a second high potential open fault including an open fault of the third switch SW3, or a second low potential open fault including an open fault of the fourth switch SW4 has occurred.

Next, determination of a short fault of the first to fourth switches will be described.

Figure 5A:
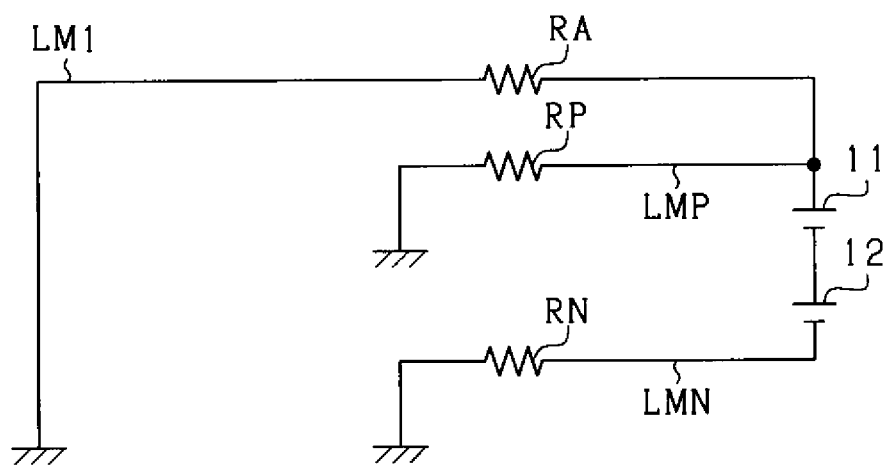
FIGS. 5A and 5B are diagrams each showing an equivalent circuit in the voltage detection apparatus when a short fault has occurred on the first switch.
Figure 5B:
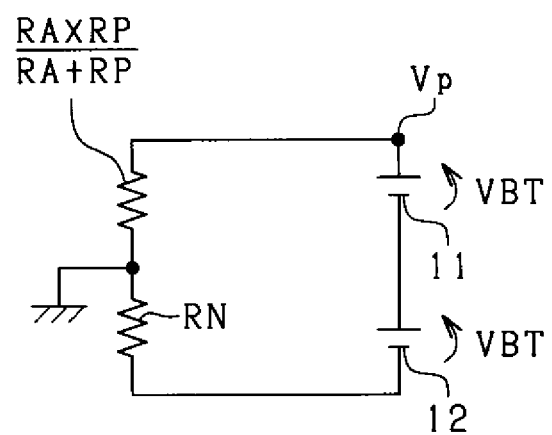

FIGS. 5A and 5B illustrates equivalent circuits when a short fault has occurred on only the first switch SW1 under a condition where the first and second bypass resistors 50 and 60 are not provided and the first to fourth switches SW1 to SW4 are controlled to be closed. In FIG. 5A, the positive electrode side path LMP is defined as an electrical path from the positive electrode terminal of the first battery module 11 to the ground GND via the first insulation resistor 13*a*, and the negative electrode side path LNP is defined as an electrical path from the negative electrode terminal of the second battery module 12 to the ground GND via the second insulation resistor 13*b*. In FIG. 5A, Rp represents resistance of the first insulation resistor 13*a*, Rn represents resistance of the second insulation resistor 13*b*. The equivalent circuit shown in FIG. 5A is modified to produce the equivalent circuit shown in FIG. 5B. According to the present embodiment, a condition of Rp≠ Rn≠ Rag1 is defined.

The positive electrode side potential Vp of the first battery module 11 shown in FIG. 5B is expressed by the following equation (eq5).

$$V_p = \frac{\frac{RA \times RP}{RA + RP}}{RN + \frac{RA \times RP}{RA + RP}} \times VBT \qquad \text{(eq 5)}$$

Also, the first output voltage Va is expressed by the following equation (eq6).

$$V_a = \frac{R_{ag2}}{R_{ag1}} \times (V_{off1} - V_p) + V_{off1} \qquad \text{(eq 6)}$$

The right side of the above-equation (eq6) includes the positive electrode potential Vp expressed by the above-equation (eq5). This means that the first output voltage Va depends on the terminal voltage VBT of the battery module and resistance Rp and Rn of the first and second insulation resistors 13*a* and 13*b*. The resistance Rp and Rn may vary depending on aging of the respective insulation resistors 13*a* and 13*b*, for example, thus lowering the accuracy for determining occurrence of fault.

Next, a case will be described in which the first bypass resistor 50 is provided. When no short fault has occurred on the first switch SW1, the first and second switches SW1 and SW2 are open and the potential of the non-inverting terminal and the inverting terminal of the first op-amp 22 are the same. In this case, the first output voltage Va substantially equals the first reference voltage Voff1 and does not depend on the terminal voltage VBT of the battery module and the resistance Rp and Rn. Hence, in the case where the first bypass resistor 50 is not provided, when a short fault has not occurred on the first switch SW1, the first output voltage Va can be fixed to the first reference voltage Voff1. On the other hand, when a short fault has occurred on the first switch SW1, the first and second switches SW1 and SW2 are closed, and the first output voltage Va is larger than the first reference voltage Voff1, corresponding to the terminal voltage of the first battery module 11. Note that the second to fourth switches SW2 to SW4 are the same as the above-described SW1 and SW2. When no short fault has occurred on the third and fourth switches SW3 and SW4, the second output voltage Vb can be fixed to the second reference voltage Voff2 by using the second bypass resistor 60.

Accordingly, in the case where either one of the first and second switches SW1 and SW2 is controlled to be closed and the other switch is controlled to be open, when the first output voltage Va equals the first reference voltage Voff1 or is close value, it is determined that no short fault has occurred on the first and second switches SW1 and SW2. On the other hand, in the case where either one of the first and second switches SW1 and SW2 is closed and the other switch is open, when the terminal voltage of the first battery module 11 calculated based on the first output voltage Va is larger than or equal to the lower limit of the allowable terminal voltage range of the battery module 11, it is determined that a short fault has occurred on a switch which is controlled to be open in the first and second switches SW1 and SW2. Further, in the case where either one of the third and fourth switches SW3 and SW4 is closed and the other switch is open, when the second output voltage Vb equals or is close to the second reference voltage Voff2, it is determined that no short fault has occurred on the third and fourth switches SW3 and SW4. In the case where either one of the third and fourth switches SW3 and SW4 is closed and the other switch is open, when the terminal voltage of the second battery module 12 calculated based on the second output voltage Vb larger than or equal to the lower limit of the allowable terminal voltage range, it is determined that a short fault has occurred on a switch which is controlled to be open in the third and fourth switches SW3 and SW4.

Figure 7:
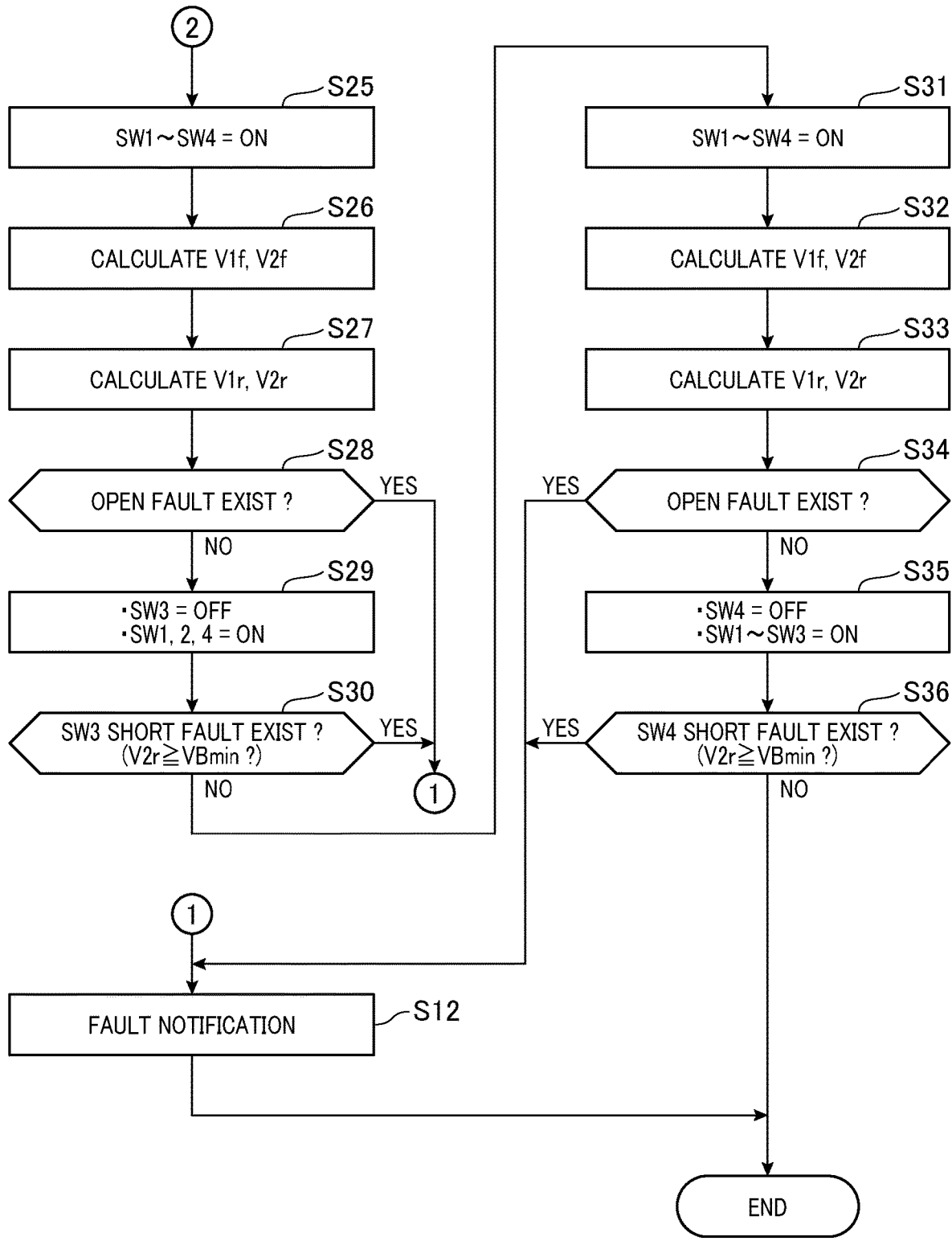
FIG. 7 is a flowchart showing a procedure of fault determination process.

Subsequently, with reference to FIGS. 6 and 7, a fault determination process executed by the control unit 40 will be described. This process is executed when the power system is activated.

At step S10, process outputs open an open switch command of the first to fourth switches SW1 to SW4.

Next at step S11, the process acquires the first output voltage Va and the second output voltage Vb. Then, the process determines, based on the acquired first output voltage Va and the second output voltage Vb whether or not an offset failure has occurred. The offset failure includes a failure in which the acquired first output voltage Va is out of the allowable voltage range of the first output voltage Va, when all of the first to fourth switches SW1 to SW4 are set to be open. Also, the offset failure includes a failure in which the acquired second output voltage Vb is out of the allowable voltage range of the second output voltage Vb, when all of the first to fourth switches SW1 to SW4 are set to be open.

When the process determines that an offset failure has occurred at step S11, proceeds to step S12, and notifies external devices that offset failure has occurred.

At step S11, when the process determines that no offset failure has occurred, at steps S13 to S16, the process determines whether or not an open fault has occurred on the first to fourth switches SW1 to SW4.

Specifically, the process outputs close-operation command for the first to fourth switches SW1 to SW4 at step S13.

Next at step S14, the terminal voltage of each battery cell 10a in the first battery module 11 is acquired from the first supervisory unit 21. Then, acquired terminal voltages are summed, thereby calculating a first main voltage V1f as the terminal voltage of the first battery module 11. Also, at step S14, the terminal voltage of each battery cell 10a in the second battery module 12 is acquired from the second supervisory unit 31. Then, acquired terminal voltages are summed, thereby calculating a second main voltage V2f as the terminal voltage of the second battery module 12. According to the present embodiment, the process of step S14 corresponds to a voltage calculating unit.

According to the present embodiment, the first and second main voltage V1f and V2f are calculated based on the terminal voltage of the first and second battery modules 11 and 12 detected at a timing synchronizing to the voltage detection timing of the first and second output voltage Va and Vb by the first and second supervisory units 21 and 31. Thus, accuracy for determining occurrence of fault is improved.

Next at step S15, the process acquires the first and second output voltage Va and Vb, and calculates a first sub voltage V1r as the terminal voltage of the first battery module 11, based on the acquired first output voltage Va. Also, the process calculates a second sub voltage V2r as the terminal voltage of the second battery module 12, based on the acquired second output voltage Vb.

Subsequently, at step S16, the process determines, based on the first main voltage V1f and the first sub voltage V1r, whether or not either a first high potential open fault or a first low potential open fault has occurred. According to the present embodiment, the process determines that either the first high potential open fault or the first low potential open fault has occurred, when determining that the first sub voltage V1r is smaller than a value where the first voltage $\Delta V1$ is subtracted from the first main voltage V1f. When an open fault has occurred, the first sub voltage V1r becomes extremely smaller than the first main voltage V1f. When determining that the first high potential open fault or the first low potential open fault has occurred, at step S16, the process proceeds to step S12 and notifies the external devices that an open fault has occurred.

Also, at step S16, the process determines, based on the second main voltage V2f and the second sub voltage V2r, whether or not either a second high potential open fault or a second low potential open fault has occurred. According to the present embodiment, the process determines that either the second high potential open fault or the second low potential open fault has occurred, when determining that the second sub voltage V2r is smaller than a value where the second voltage $\Delta V2$ is subtracted from the second main voltage V2f. When determining that the second high potential open fault or the second low potential open fault has occurred, at step S16, the process proceeds to step S12 and notifies the external devices that an open fault has occurred.

Note that the first voltage $\Delta V1$ and the second voltage $\Delta V2$ may be set to be the same value or different values.

At step S16, the process may determine that a fault has occurred related to the voltage detection, when the process determines that the first sub voltage V1r is larger than a value where the first voltage $\Delta V1$ is added to the first main voltage V1f, or determines that the second sub voltage V2r is larger than a value where the second voltage $\Delta V2$ is added to the second main voltage V2f.

When determining that no open fault has occurred at step S16, the process proceeds to step S17 and outputs an open switch command of the first switch SW1, and a close switch command of the second to fourth switches SW2 to SW4. Thus, only the first switch SW1 is controlled to be open among the first to fourth switches SW1 to SW4.

Next at step S18, the process determines whether or not a fault has occurred on the first switch SW1 based on the first sub voltage V1r. According to the present embodiment, the process determines that a short fault on the first switch SW1 has occurred, when the first sub voltage V1r is determined as a minimum value VBmin of the allowable terminal voltage range of the first battery module 11 or more. In other words, when a short fault has occurred on the first switch SW1, the first sub voltage V1r is within the allowable terminal voltage range of the first battery module 11. On the other hand, when no short fault has occurred on the first switch SW1, the first output voltage Va is fixed to the first reference voltage Voff1 or around the value thereof. As a result, the first sub voltage V1r becomes a value which is less than the minimum value VBmin of the allowable terminal voltage range of the first battery module 11.

At step S18, when the process determines that a short fault has occurred on the first switch SW1, the process proceeds to step S12 and notifies the external device that the fault has occurred.

At step S18, when the process determines that no shot fault has occurred, the same processes corresponding to steps S13 to S16 are executed at steps S19 to S22.

At step S22, when the process determines that no open fault has occurred, the process proceeds to step S23 and outputs an open switch command of the second switch SW2, and a close switch command of the first, third and fourth switches SW1, SW3 and SW4.

Next at step S24, the process determines, based on the first sub voltage V1r, whether or not a short fault has occurred on the second switch SW2. According to the present embodiment, when the first sub voltage V1r is determined as the minimum value VBmin of the allowable terminal voltage range of the first battery module 11 or more, the process determines that a short fault has occurred on the second switch SW2.

At step S24, when determining that a short fault has occurred on the second switch SW2, the process proceeds to step S12 and notifies the external devices that a short fault has occurred on the second switch SW2.

When determining that no short fault has occurred at step S24, the same processes corresponding to steps S25 to S28 are executed at steps S13 to S16.

At step S28, when the process determines that no open fault has occurred, the process proceeds to step S29 and outputs an open switch command of the third switch SW3, and a close switch command of the first, second and fourth switches SW1, SW2 and SW4.

Subsequently, at step S30, the process determines, based on the second sub voltage V2r, whether or not a short fault has occurred on the third switch SW3. According to the present embodiment, when the second sub voltage V2r is determined as the minimum value VBmin of the allowable terminal voltage range of the second battery module 12 or more, the process determines that a short fault has occurred on the third switch SW3.

When determining that a short fault has occurred on the third switch SW3 at step S30, the process proceeds to step S12 and notifies the external devices that the short fault has occurred on the third switch SW3.

When determining that no short fault has occurred at step S30, the same processes corresponding to steps S13 to S16 are executed at steps S31 to S34.

When determining that no open fault has occurred at step S34, the process proceeds to step S35 and outputs an open switch command of the fourth switch SW4, and a close switch command of the first to third switches SW1 to SW3.

Next at step S36, the process determines, based on the second sub voltage V2r, whether or not a short fault has occurred on the fourth switch SW4. According to the present embodiment, the process determines that a short fault has occurred on the fourth switch SW4, when determining that the second sub voltage V2r is the minimum value VBmin of the allowable terminal voltage range of the second battery module 12 or more.

At step S36, when determining that a short fault has occurred on the fourth switch SW4, the process proceeds to step S12 and notifies the external devices that the short fault has occurred on the fourth switch SW4

Figure 8:
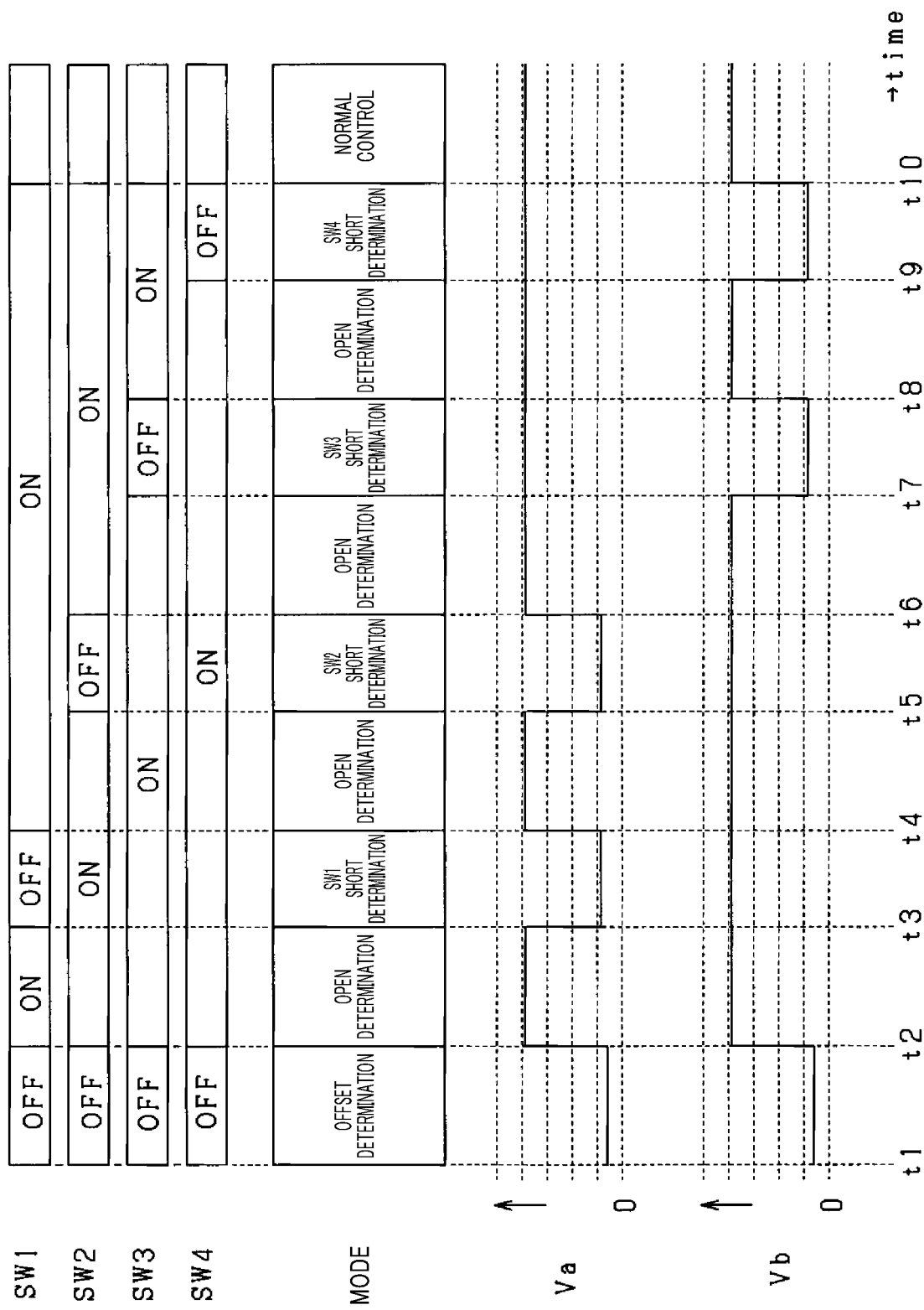
FIG. 8 is a timing diagram showing a procedure of fault determination process.

According to the present embodiment, processes of steps S16, S18, S22, S24, S28, S30, S34 and S36 correspond to determining unit. FIG. 8 illustrates an embodiment of the fault determination process.

At time t1 to t2, processes of steps S10 and S11 are executed to determine that no offset failure has occurred. At time t2 to t3, processes of steps S13 to S16 are executed to determine that no open fault has occurred. At time t3 to t4, processes of steps S17 and S18 are executed to determine that no short fault has occulted on the first switch SW1. In the processes at time t3 to t4, the first switch SW1 corresponds to an object switch, and the first differential amplifier 22 corresponds to an object detection unit.

At time t4 to t5, processes of steps S19 to S22 are executed to determine that no open fault has occurred. At time t5 to t6, processes of steps S23 to S24 are executed to determine that no short fault has occurred on the second switch SW1. In the processes at time t5 to t6, the second switch SW2 corresponds to an object switch, and the first differential amplifier 22 corresponds to an object detection unit.

At time t6 to t7, processes of steps S25 to S28 are executed to determine that no open fault has occurred. At time t7 to t8, processes of steps S29 to S30 are executed to determine that no short fault has occurred on the third switch SW3. In the processes at time t7 to t8, the third switch SW3 corresponds to an object switch, and the second differential amplifier 32 corresponds to an object detection unit.

At time t8 to t9, processes of steps S31 to S34 are executed to determine that no open fault has occurred. At time t9 to t10, processes of steps S35 to S36 are executed to determine that no short fault has occurred on the fourth switch SW4. In the processes at time t9 to t10, the fourth switch SW4 corresponds to an object switch, and the second differential amplifier 32 corresponds to an object detection unit.

Note that, in the present embodiment, at least a group of processes is not necessarily executed among a group of processes of steps S19 to S22, a group of processes of steps S25 to S28, and a group of processes of steps S31 to S34.

As described, according to the present embodiment, the voltage detection apparatus 20 is provided with the first bypass resistor 50 and the second bypass resistor 60. Accordingly, accuracy for detecting occurrence of any of a first high potential side fault, a first low potential side fault, a second high potential side fault and a second low potential side fault can be improved.

Second Embodiment

Hereinafter, with reference to the drawings, a second embodiment will be described. In the second embodiment, differences between the first embodiment and the second embodiment will mainly be described. According to the present embodiment, determination method of a short fault on respective switches SW1 to SW4 is changed.

Figure 9:
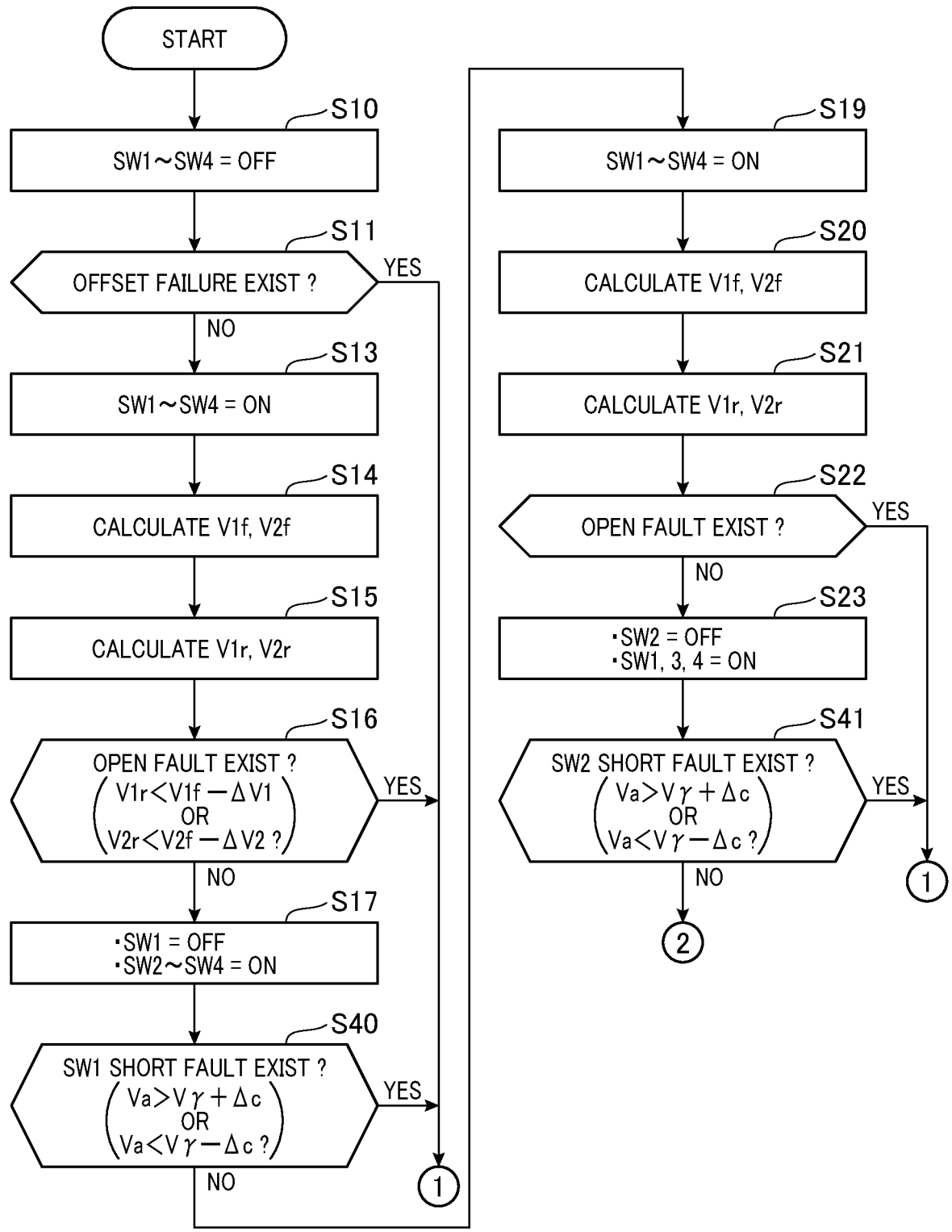
FIG. 9 is a flowchart showing a procedure of fault determination process according to a second embodiment.
Figure 10:
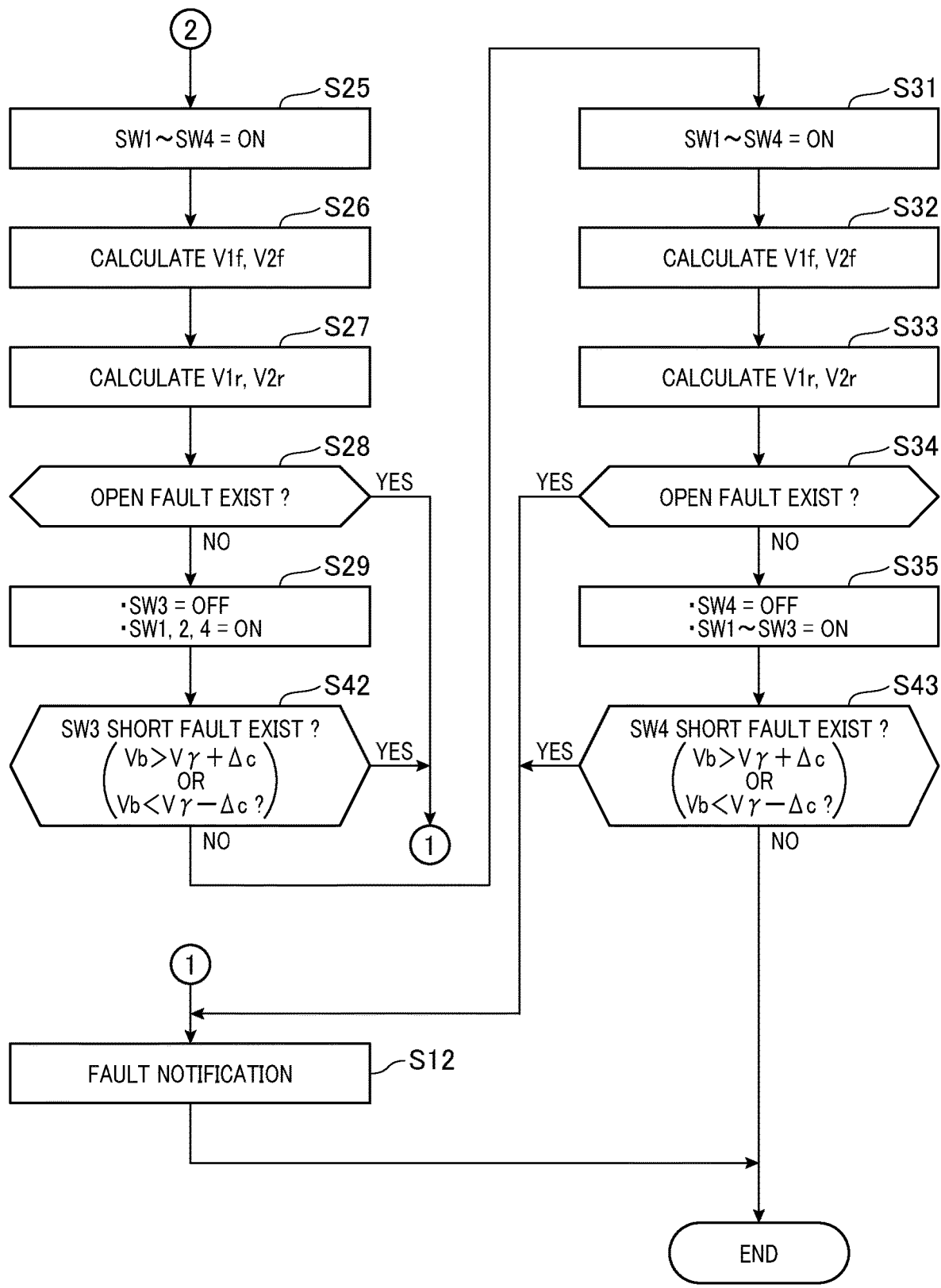
FIG. 10 is a flowchart showing a procedure of fault determination process.

In FIGS. 9 and 10, a fault determination process executed by the control unit 40 will be described. Note that the same reference numbers are applied to processes as same as the processes shown in FIGS. 6 and 7.

As shown in FIG. 9, at step S40, when determining that the first output voltage Va is larger than a value in which a determined value $\Delta c$ is added to the regulated voltage V$\gamma$ or the first output voltage Va is smaller than a value in which a determined value $\Delta c$ is subtracted from the regulated voltage V$\gamma$, the process determines that a short fault has occurred on the first switch SW1. Note that the determined value $\Delta c$ may be set to be smaller than the regulated voltage V$\gamma$, for example.

At step S41, when determining that the first output voltage Va is larger than a value in which the determined value $\Delta c$ is added to the reregulated voltage V$\gamma$ or the first output voltage Va is smaller than a value in which the determined value $\Delta c$ is subtracted from the reregulated voltage V$\gamma$, the process determines that a short fault has occurred on the second switch SW2.

As shown in FIG. 10, at step S42, when determining that the second output voltage Vb is larger than a value in which the determined value $\Delta c$ is added to the reregulated voltage V$\gamma$ or the second output voltage Vb is smaller than a value in which the determined value $\Delta c$ is subtracted from the reregulated voltage V$\gamma$, the process determines that a short fault has occurred on the third switch SW3.

At step S43, when determining that the second output voltage Vb is larger than a value in which the determined value Δc is added to the reregulated voltage Vγ or the second output voltage Vb is smaller than a value in which the determined value Δc is subtracted from the reregulated voltage Vγ, the process determines that a short fault has occurred on the fourth switch SW4.

According to the above-described embodiment, similar to the above-described embodiment, accuracy for detecting a short fault on any of the first to fourth switches SW1 to SW4 can be improved.

Third Embodiment

Figure 11:
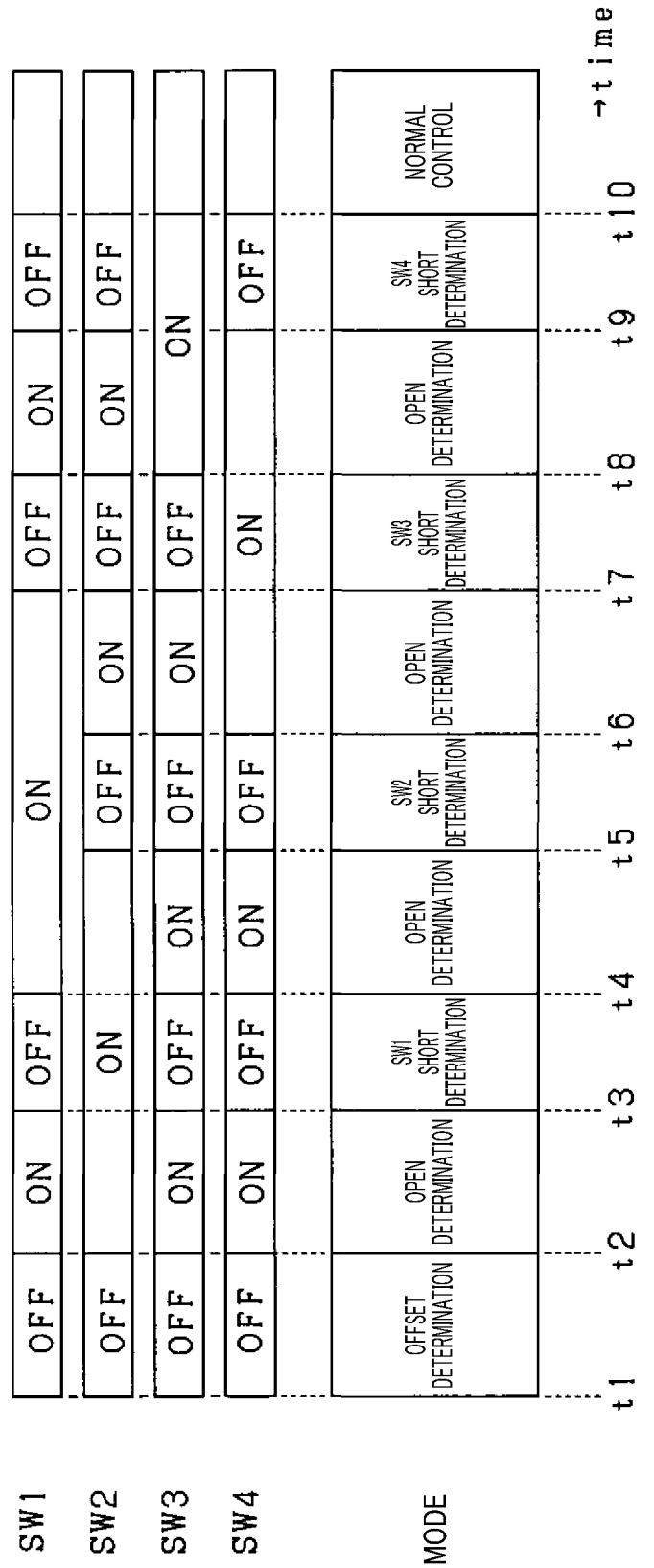
FIG. 11 is a timing diagram showing a fault determination process according to a third embodiment.

Hereinafter, with reference to the drawings, a third embodiment will be described. In the third embodiment, differences between the first embodiment and the third embodiment will mainly be described. According to the present embodiment, as shown in FIG. 11, setting of the switches SW1 to SW4 is changed for the fault determination process. In FIG. 11, the fault determination process of time t2 to t3, t4 to t5, t6 to t7, and t8 to t9 are the same as the open fault determination processes shown in FIG. 8.

At time t3 to t4, only the second switch SW2 is controlled to be closed among the first to fourth switches SW1 to SW4. In this control, a process of step S18 is executed to determine whether or not a short fault has occurred on the first switch SW1. Note that, in the processes of time t3 to t4, the second switch SW2 corresponds to an object switch and the first differential amplifier 22 corresponds to an object detection unit.

At time t5 to t6, only the first switch SW1 is controlled to be closed among the first to fourth switches 1 to 4. In this control, a process of step S24 is executed to determine whether or not a short fault has occurred on the second switch SW2. Note that, in the processes of time t5 to t6, the first switch SW1 corresponds to an object switch and the first differential amplifier 22 corresponds to an object detection unit.

At time t7 to t8, only the fourth switch SW4 is controlled to be closed among the first to fourth switches SW1 to SW4. In this control, a process of step S30 is executed to determine whether or not a short fault has occurred on the third switch SW3. Note that, in the processes of time t7 to t8, the fourth switch SW4 corresponds to an object switch and the second differential amplifier 32 corresponds to an object detection unit.

At time t9 to t10, only the third switch SW3 is controlled to be closed among the first to fourth switches SW1 to SW4. In this control, a process of step S36 is executed to determine whether or not a short fault has occurred on the third switch SW3. Note that, in the processes of time t9 to t10, the third switch SW3 corresponds to an object switch and the second differential amplifier 32 corresponds to an object detection unit.

According to the present embodiment as described above, similar effects to the first embodiment can be obtained.

Fourth Embodiment

Figure 12:
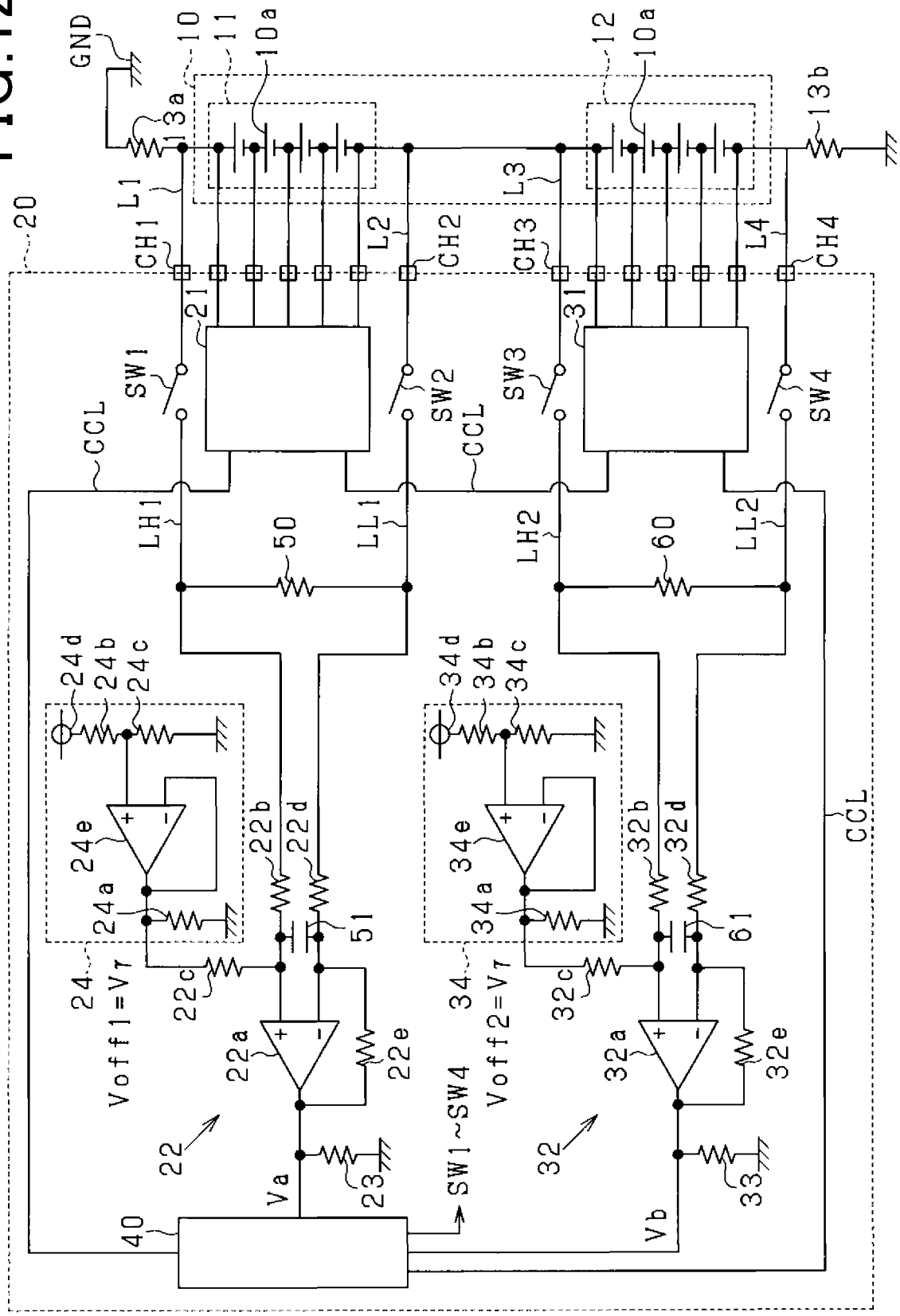
FIG. 12 is an overall diagram showing a power system and a voltage detection apparatus according to a fourth embodiment.

Hereinafter, with reference to the drawings, a forth embodiment will be described. In the fourth embodiment, differences between the fourth embodiment and the above-described first embodiment will mainly be described. According to the present embodiment, as shown in FIG. 12, the voltage detection apparatus 20 is provided with a first capacitor 51 and a second capacitor 61. Note that, in FIG. 12, the same reference numbers are applied to configurations as same as those shown in FIG. 1, for the sake of convenience.

The first end of the first capacitor 51 is connected to the first high potential path LH1 at a point closer to the first op-amp 22a side than to the first resistor 22b. The second end of the first capacitor 51 is connected to the first low potential path LL1 at a point closer to the first op-amp 22a side than to the third resistor 22d.

The first end of the second capacitor 61 is connected to the second high potential path LH2 at a point closer to the second op-amp 32a side than to the sixth resistor 32b. The second end of the second capacitor 61 is connected to the second low potential path LL2 at a point closer to the second op-amp 32a side than to the eighth resistor 32d.

According to the present embodiment, in the process shown in FIG. 8, an off mode that opens the first to fourth switches SW1 to SW4 is inserted into the latter part of the process at time t2 to t3. Thus, the front part of the process at time t2 to t3 is determined for charging the first capacitor 51, and for detecting the first and second voltages Va and Vb used for the fault detecting process in the period of the off mode. Similarly, the off mode is implemented to the latter part of each of the processes at time t3 to t4, t4 to t5, t6 to t7, t7 to t8, t8 to t9 and t9 to t10.

According to the above-described present embodiment, similar effects to the above-described first embodiment can be obtained.

Other Embodiment

The above-described embodiments can be modified as follows.

As the supervisory unit, it is not limited to a configuration that individually detects each terminal voltage corresponding to the respective battery cells that constitute the battery module. However, the supervisory unit may detect terminal voltage of a series-connected body of the battery cells of which the number of cells is less than the number of cells required for constitute the battery module, for example, two battery cells.

The resistance of the first resistor 50 may be set to be different from the resistance of the second bypass resistor 60.

As the high potential side switch and the low potential side switch, it is not limited to the N-channel MOSFET but other type of switches may be used.

The first and second switches SW1 and SW2 may be controlled to be open or close by the first supervisory unit 21. In this case, when the terminal voltage of the first battery module 11 is detected, the control unit 40 may output a close switch command of the first and second switches SW1 and SW2 to the first supervisory unit 21 via a communication line CCL, for example. Also, the third and fourth switches SW3 and SW4 may be controlled to be open and closed by the second supervisory unit 31. In this case, when detecting the terminal voltage of the second battery module 12, the control unit 40 may output a close switch command of the third and fourth switches SW3 and SW4 to the second supervisory unit 31 via the communication line CCL.

As the sub voltage detection unit is not limited to a differential amplifier circuit, but any other configuration may be used.

A connection method of the communication line between the supervisory units 21 and 31 and the control unit 40 is not limited to a daisy chain method. For example, a bus connection may be used, in which dedicated communication lines connected to respective supervisory circuits 21 and 31 are connected to a common communication line connected to the control unit 40.

The number of battery cells that constitutes the battery module is not limited to 4, but may be 2, 3, 5 or more. Moreover, the number of battery cells that constitute the battery module is not necessarily the same between the battery modules.

The number of battery modules that constitutes the battery pack is not limited to plural number, but may be one. In this case, one supervisory unit may be provided for the voltage detection apparatus.

As the battery pack, it is not limited to a configuration having single series-connected body in which a plurality of battery cells are connected in series. For example, a plurality of series-connected bodies each including a plurality of battery cells may be provided, and the series-connected bodies may be connected in parallel with each other, thereby composing a battery pack.

A system to which the voltage detection apparatus is applied is not limited to a system which is mounted on a vehicle.

What is claimed is:

1. A voltage detection apparatus applied to a system provided with a battery pack including a series-connected body of a plurality of battery cells comprising:
    a detection block configured of the series-connected body including at least two battery cells in the battery cells that constitutes the battery pack;
    a main voltage detection unit that detects a terminal voltage of an object battery, the object battery being each of the battery cells that constitute the detection block or the series-connected body composed of battery cells of which the number of cells is less than that of the battery cells constituting the detection block;
    a high potential path electrically connected to a positive electrode side of the detection block at a first end of the high potential path;
    a low potential path electrically connected to a negative electrode side of the detection block at a first end of the low potential path;
    a sub voltage detection unit electrically connected to a second end of the high potential path and a second end of the low potential path, detecting a terminal voltage of the detection block based on a potential difference between the high potential path and the low potential path;
    a high potential switch disposed on the high potential path, opening and closing the high potential path;
    a low potential switch disposed on the low potential path, opening and closing the low potential path; and
    a bypass resistor that electrically connects the high potential path and the low potential path, the high potential path and the low potential path being connected between a point closer to the sub voltage detection unit than to the high potential switch on the high potential path, and a point closer to the sub voltage detection unit than to the low potential switch on the low potential path.

2. The voltage detection apparatus according to claim 1, wherein
    the apparatus includes a determining unit that determines, based on the terminal voltage of the sub voltage detection unit, whether a high potential side fault or a low potential side fault has occurred,
    the high potential side fault being a fault of a portion between a positive electrode side of the detection block and an input side of the sub voltage detection unit through the high potential path, and
    the low potential side fault being a fault of a portion between a negative electrode side of the detection block and an input side of the sub voltage detection unit through the low potential path.

3. The voltage detection apparatus according to claim 2, wherein
    the apparatus includes a voltage calculation unit that calculates, based on the terminal voltage detected by the main voltage detection unit, a calculation terminal voltage of the detection block;
    the determination unit determines, based on the terminal voltage detected by the sub voltage detection unit and the calculation terminal voltage calculated by the voltage calculation unit, whether the high potential side fault or the low potential side fault has occurred.

4. The voltage detection apparatus according to claim 3, wherein
    the high potential side fault includes a high potential open fault in which a positive electrode side of the detection block and an input side of the sub voltage detection unit are electrically cutoff;
    the low potential side fault includes a low potential open fault in which a negative electrode side of the detection block and an input side of the sub voltage detection unit are electrically cutoff; and
    the determination unit determines, based on the terminal voltage detected by the sub voltage detection unit and the calculation terminal voltage calculated by the voltage calculation unit, whether the high potential open fault or the low potential open fault has occurred, when both of the high potential switch and the low potential switch are controlled to be closed.

5. The voltage detection apparatus according to claim 3, wherein
    the voltage calculation unit calculates the calculation terminal voltage of the detection block by using a detection value of the main voltage detection unit which is detected at a timing synchronizing to a voltage detection timing of the sub voltage detection unit.

6. The voltage detection apparatus according to claim 2, wherein
    the high potential side fault includes a short fault of the high potential switch;
    the low potential side fault includes a short fault of the low potential switch; and
    the determination unit determines, based on the terminal voltage detected by the sub voltage detection unit, whether a short fault of the high potential switch or a short fault of the low potential switch has occurred, when either one of the high potential switch or the low potential switch are controlled to be closed, and the other one of the switches is controlled to be opened.

7. The voltage detection apparatus according to claim 6, wherein
    the battery pack includes series-connected bodies corresponding to a plurality of detection blocks;
    the main voltage detection unit, the high potential path, the low potential path, the high potential switch, the low potential switch and the sub voltage detection unit are provided for each of the plurality of detection blocks;
    an object switch is determined as any one of the plurality of high potential switches and the plurality of low potential switches;

an object detection unit is determined as the sub voltage detection unit of which the voltage detection object is the detection block corresponding to the object switch;

the determination unit determines, based on a terminal voltage detected by the object detection unit, whether a short fault of the high potential switch or a short fault of the low potential switch has occurred, when the object switch is controlled to be opened and the rest of switches in the plurality of high potential switches and the plurality of low potential switches are controlled to be closed, or the object switch is controlled to be closed and rest of switches in the plurality of high potential switches and the plurality of low potential switches are controlled to be opened.

8. The voltage detection apparatus according to claim 1, wherein the apparatus includes a power unit electrically connected to the high potential path at a point closer to the sub voltage detection unit than to a point connected to the bypass resistor on the high potential path, outputting a reference voltage.

9. The voltage detection apparatus according to claim 1, wherein the system includes a first insulation resistor that electrically connects a positive electrode side of the battery pack and a ground of the system; and a second insulation resistor that electrically connects a negative electrode side of the battery pack and a ground of the system.

\* \* \* \* \*